United States Patent
Xu et al.

(10) Patent No.: US 10,658,973 B2
(45) Date of Patent: May 19, 2020

(54) RECONFIGURABLE ALLOCATION OF VNCAP INTER-LAYER VIAS FOR CO-TUNING OF L AND C IN LC TANK

(71) Applicant: International Business Machines Corporation, Armonk, NY (US)

(72) Inventors: Zheng Xu, Wappingers Falls, NY (US); Hung Tran, Chicago, IL (US); Qianwen Chen, Yorktown Heights, NY (US); Ruqiang Bao, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/967,049

(22) Filed: Apr. 30, 2018

(65) Prior Publication Data

US 2019/0334477 A1  Oct. 31, 2019

(51) Int. Cl.
*H03B 5/08* (2006.01)
*H05K 3/40* (2006.01)
*H05K 3/30* (2006.01)
*H03B 1/00* (2006.01)

(52) U.S. Cl.
CPC .............. *H03B 5/08* (2013.01); *H03B 1/00* (2013.01); *H05K 3/30* (2013.01); *H05K 3/4038* (2013.01)

(58) Field of Classification Search
CPC ... H03B 5/08; H03B 1/00; H05K 3/30; H05K 3/4038
See application file for complete search history.

(56) References Cited

U.S. PATENT DOCUMENTS

| | | | |
|---|---|---|---|
| 7,816,197 B2 | 10/2010 | Kim et al. |
| 7,859,825 B2 | 12/2010 | Kim et al. |
| 7,898,481 B2 | 3/2011 | Qian et al. |
| 8,115,276 B2 | 2/2012 | Zhang et al. |
| 9,325,277 B1 | 4/2016 | Bekele et al. |
| 2001/0035797 A1 | 11/2001 | Gutierrez |

(Continued)

OTHER PUBLICATIONS

I.M. Kang et al., "RF model of BEOL vertical natural capacitor (VNCAP) fabricated by 45-nm RF CMOS technology and its verification," IEEE Electron Device Letters, vol. 30, No. 5, May 2009, pp. 538-540.

(Continued)

*Primary Examiner* — Jeffrey M Shin
(74) *Attorney, Agent, or Firm* — Vazken Alexanian; Michael J. Chang, LLC (57) ABSTRACT

Techniques for co-tuning of inductance (L) and capacitance (C) in a VNCAP-based LC tank oscillator are provided. In one aspect, an LC tank oscillator includes: a capacitor including at least two metal layers, each metal layer having metal fingers that are interdigitated, wherein an orientation of the metal fingers alternates amongst the at least two metal layers; and an inductor on the capacitor. Inter-layer vias can be present interconnecting the at least two metal layers creating conductive loops between the metal fingers, wherein an arrangement of the inter-layer vias in an area between the at least two metal layers is configured to co-tune both inductance and capacitance in the LC tank oscillator. A method of operating an LC tank oscillator and a method of co-tuning inductance and capacitance in an LC tank oscillator are also provided.

19 Claims, 12 Drawing Sheets

(56) References Cited

U.S. PATENT DOCUMENTS

| | | | |
|---|---|---|---|
| 2006/0163692 A1* | 7/2006 | Detecheverry | H01L 23/5222 |
| | | | 257/531 |
| 2009/0049414 A1 | 2/2009 | Mutnury et al. | |
| 2009/0213522 A1 | 8/2009 | Kim et al. | |
| 2010/0244972 A1* | 9/2010 | Tanabe | H01F 17/0013 |
| | | | 331/117 FE |
| 2013/0093045 A1* | 4/2013 | Cho | H01L 23/5223 |
| | | | 257/531 |
| 2016/0351309 A1* | 12/2016 | Caffee | H01F 17/0013 |

OTHER PUBLICATIONS

Z.Z. Oo, "Systematic modeling of on-chip power grids with decaps in TSV-based 3D chip integration," 15th Electronics Packaging Technology Conference, Dec. 2013, pp. 575-578.

C-D. Wang et al., "Bandwidth enhancement based on optimized via location for multiple vias EBG power/ground planes," IEEE Transactions on Components, Packaging and Manufacturing Technology, vol. 2, No. 2, Feb. 2012, pp. 332-341.

\* cited by examiner

| Configuration | L (nH) |
|---|---|
| Baseline | 2.117 |
| 100% inter-layer via density | 0.938 |
| 0% inter-layer via density | 1.995 |
| Center – 40% inter-layer via density | 1.245 |
| Center - 10% inter-layer via density | 1.8 |
| O-shaped – 60% inter-layer via density | 0.952 |
| O-shaped – 90% inter-layer via density | 0.983 |

RECONFIGURABLE ALLOCATION OF VNCAP INTER-LAYER VIAS FOR CO-TUNING OF L AND C IN LC TANK

FIELD OF THE INVENTION

The present invention relates to an inductor-capacitor (LC) tank oscillator, and more particularly, to a reconfigurable allocation of inter-layer vias in a vertical natural capacitor (VNCAP)-based LC tank oscillator for co-tuning of inductance (L) and capacitance (C).

BACKGROUND OF THE INVENTION

As its name implies, an inductor-capacitor (LC) tank includes a capacitor connected to an inductor. An LC tank uses magnetic resonance to produce an oscillating electromagnetic frequency.

An integrated, high-Q (quality factor) LC tank is often required in communication systems (e.g., for up-conversion/down-conversion), sampled analog applications (e.g., for analog-to-digital converter, filter, etc.) and microprocessors. It is characterized by oscillation amplitude (or power), frequency, stability, phase noise and tuning range.

Conventional LC tanks have independently working inductors (L) and capacitors (C), which generally do not affect each other's operation. Typically, the tuning of a conventional LC tank is done by varying the capacitance (C) elements, while the inductance (L) element is fixed.

Therefore, enhanced efficiency LC tank designs enabling co-tuning of inductance and capacitance elements would be desirable.

SUMMARY OF THE INVENTION

The present invention provides techniques for co-tuning of inductance (L) and capacitance (C) in a vertical natural capacitor (VNCAP)-based inductor-capacitor (LC) tank oscillator by the reconfigurable allocation of VNCAP inter-layer vias. In one aspect of the invention, an LC tank oscillator is provided. The LC tank oscillator includes: a capacitor including at least two metal layers, each metal layer having metal fingers that are interdigitated, wherein an orientation of the metal fingers alternates amongst the at least two metal layers; and an inductor on the capacitor. VNCAP inter-layer vias can be present interconnecting the at least two metal layers stacking metal fingers, wherein an arrangement of the inter-layer vias in an area between the at least two metal layers is configured to co-tune both inductance and capacitance in the LC tank oscillator.

In another aspect of the invention, a method of operating an LC tank oscillator is provided. The method includes: providing the LC tank oscillator including a capacitor and an inductor on the capacitor, the capacitor including: i) at least two metal layers, each metal layer having metal fingers that are interdigitated, wherein an orientation of the metal fingers alternates amongst the at least two metal layers, and ii) inter-layer vias interconnecting the at least two metal layers; initiating oscillations in the LC tank oscillator; and inducing a net eddy current in the capacitor based on an arrangement of the inter-layer vias, whereby the net eddy current tunes inductance in the LC tank oscillator.

In yet another aspect of the invention, a method of co-tuning inductance and capacitance in an LC tank oscillator is provided. The method includes: forming the LC tank oscillator including: a capacitor having i) at least two metal layers, each metal layer having metal fingers that are interdigitated, wherein an orientation of the metal fingers alternates amongst the at least two metal layers, and ii) inter-layer vias interconnecting the at least two metal layers, and wherein the forming further includes varying an arrangement of the inter-layer vias in an area between the at least two metal layers to co-tune both inductance and capacitance in the LC tank oscillator; and forming an inductor on the capacitor.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for wide-range co-tuning of inductance (L) and capacitance (C) elements in an inductor-capacitor (LC) tank oscillator by regulating the eddy current flow through an arrangement of vertical natural capacitor (VNCAP) inter-layer vias. Advantageously, oscillating frequency targets can be achieved more efficiently by concurrently changing L and C, along with a wider tuning range.

By 'co-tuning' it is meant that both the inductance (L) and the capacitance (C) elements in the present design are able to change, as compared to conventional LC tank configurations where tuning is done by varying the capacitance (C) element while the inductance (L) element is fixed (see above). By way of example only, the VNCAP element can be tuned by changing its dimensions (i.e., size) and/or layer combinations to vary its capacitance (C). Further, as will be described in detail below, the arrangement of the VNCAP inter-layer vias can be changed to tune inductance (L). Thus, with the present designs, both L and C are able to change.

Namely, the present LC tank oscillator designs include an inductor on top of a VNCAP structure. As will be described in detail below, the VNCAP structure is a multi-layer, interdigitated finger capacitor having vias interconnecting the layers (also referred to herein as "inter-layer vias"). During operation, there are electrical and magnetic couplings between the inductor and the VNCAP. Namely, electrical charge moves from the VNCAP to the inductor, whereby the inductor becomes electromagnetically charged. Once the charge on the inductor exceeds that of the VNCAP, energy flows back toward the VNCAP electromagnetically charging the VNCAP. This process repeats itself over and over creating electromagnetic oscillations. As the oscillation frequency increases, the inductor will induce eddy current loops in the VNCAP. The inductor-induced eddy current loops then interactively change the inductor characteristics backwards, so inductance will be varied and that is where the co-tuning happens.

Furthermore, employing different via arrangements in the VNCAP changes the net eddy current flow direction and/or magnitude. Thus, the VNCAP in the present design not only serves as a varactor in the LC tank oscillator, it also becomes a natural metal groundplane to tune the inductor. With the varactor changing capacitance (C) and the inductor being tuned by the eddy currents, both capacitance (C) and inductance (L) are shifted.

For demanding analog designs, the present LC tank design structure has some notable attributes. For instance, there is no area loss in implementing this design since a vertical integration scheme is employed with the inductor being placed on top of the VNCAP varactor. Further, as highlighted above, being able to co-tune L and C enables oscillating frequency targets to be achieved faster and thus more efficiently, and the present LC tank designs are fully complementary metal-oxide semiconductor (CMOS) process compatible. Also, the designs provide a higher maximum oscillation frequency ($f_{max}$) specification. For instance, based on:

$$f_{max} = \frac{1}{\sqrt{(L*C)}},$$

the inductance (L) is decreased by adding more inter-layer vias. As a result, $f_{max}$ will be greater.

Figure 1:
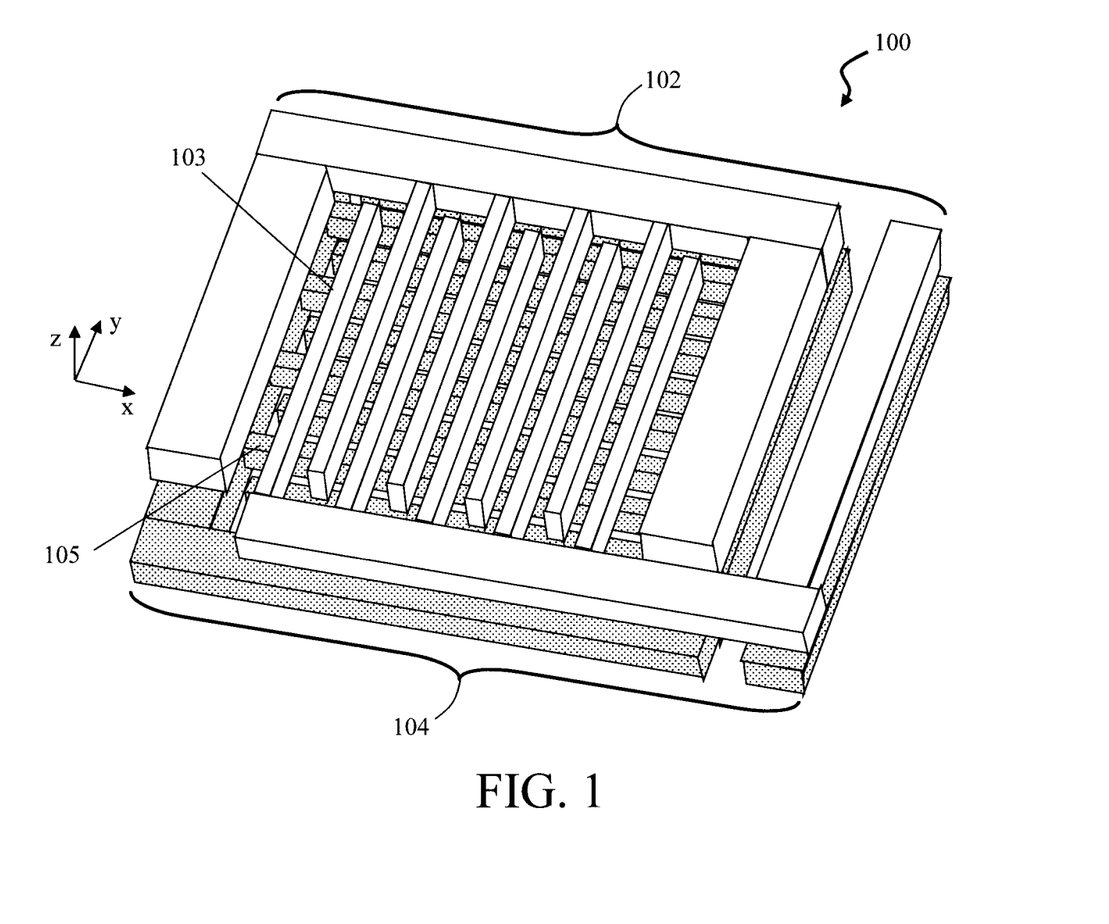
FIG. 1 is a three-dimensional diagram illustrating an exemplary capacitor according to an embodiment of the present invention.

FIG. 1 is a diagram illustrating an exemplary capacitor 100 that may be used in accordance with the present techniques. Capacitor 100 has a VNCAP structure. For a general discussion of VNCAP capacitors see, for example, U.S. Patent Application Publication Number 2009/0213522 by Kim et al., entitled "On-Chip Adjustment of MIMCAP and VNCAP capacitors," the contents of which are incorporated by reference as if fully set forth herein.

According to an exemplary embodiment, capacitor 100 is a multi-layer, interdigitated finger capacitor. See, for example, metal layer 102 (i.e., VNCAP Metal M) and metal layer 104 (i.e., VNCAP Metal M−1) each consisting of multiple interdigitated metal fingers 103 and 105, respectively. The metal layer 102 is stacked on top of the metal layer 104 (i.e., in the z-direction). It is notable that, while a two-layer (i.e., metal layers 102 and 104) design is shown in the figures, any multi-layer VNCAP design (having inter-layer vias therebetween) can be employed in accordance with the present techniques. Standard back-end-of-line (BEOL) metallization techniques can be employed to form capacitor 100.

The orientation of the fingers 103/105 alternates on every layer. For instance, in the example shown in FIG. 1, the fingers 103 in metal layer 102 extend along the y-direction, whereas the fingers 105 in metal layer 104 extend along the x-direction, and so on. Inter-layer vias (i.e., a VNCAP Via M−1) interconnect the metal layer 102 and the metal layer 104. The inter-layer vias are not visible in the depiction of FIG. 1 but are shown in various other figures described below. It is the arrangement of these inter-layer vias that is adjusted in accordance with the present techniques to co-tune the inductance (L) and capacitance (C) via the eddy current loops induced by the inductor in the VNCAP capacitor 100.

Figure 2:
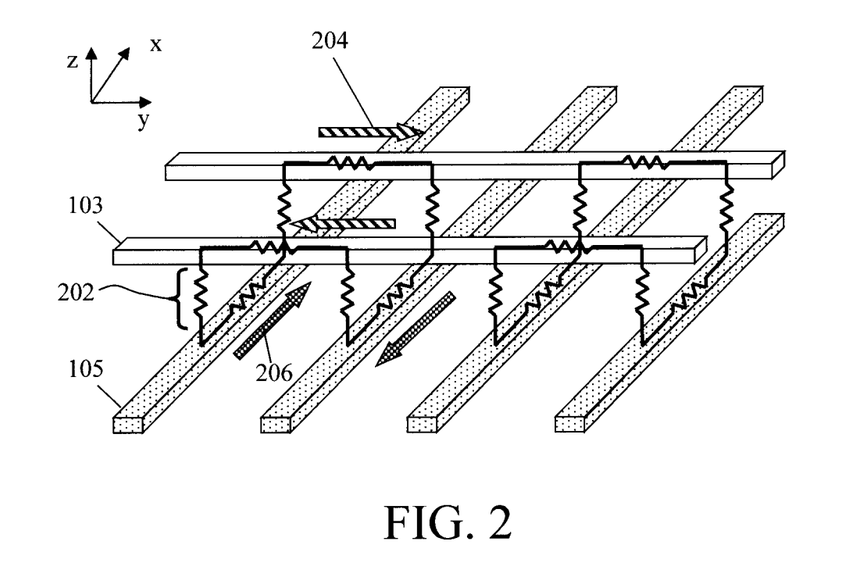
FIG. 2 is a schematic diagram of inter-layer vias of the capacitor that create numerous loops for eddy currents that affect the inductance (L) according to an embodiment of the present invention.

FIG. 2 provides a schematic diagram of the inter-layer vias of capacitor 100 that create numerous loops for eddy currents that affect the inductance (L). For clarity, only a few of each of the fingers 103 and 105 are depicted. As shown in FIG. 2, inter-layer vias 202 interconnect the fingers 103 (of metal layer 102) and the fingers 105 (of metal layer 104).

As provided above, the orientation of the fingers 103/105 alternates on every layer. Notably, by alternating the orientation of the fingers 103 vis-à-vis the orientation of fingers 105, loops for eddy currents can be created. Namely, referring to FIG. 2, the inter-layer vias 202 create loops through the fingers 103 and 105 (of metal layers 102 and 104) as indicated by arrows 204 and 206, respectively. Specifically, as indicated by arrows 204, conductive paths are present in fingers 103 along the y-direction and, as indicated by arrows 206, conductive paths are present in fingers 105 along the x-direction. The inter-layer vias 202 connect these paths into loops in the z-direction. It is notable that the creation of such conductive loops is possible because of the alternating orientation of the fingers 103 and 105.

Figure 3:
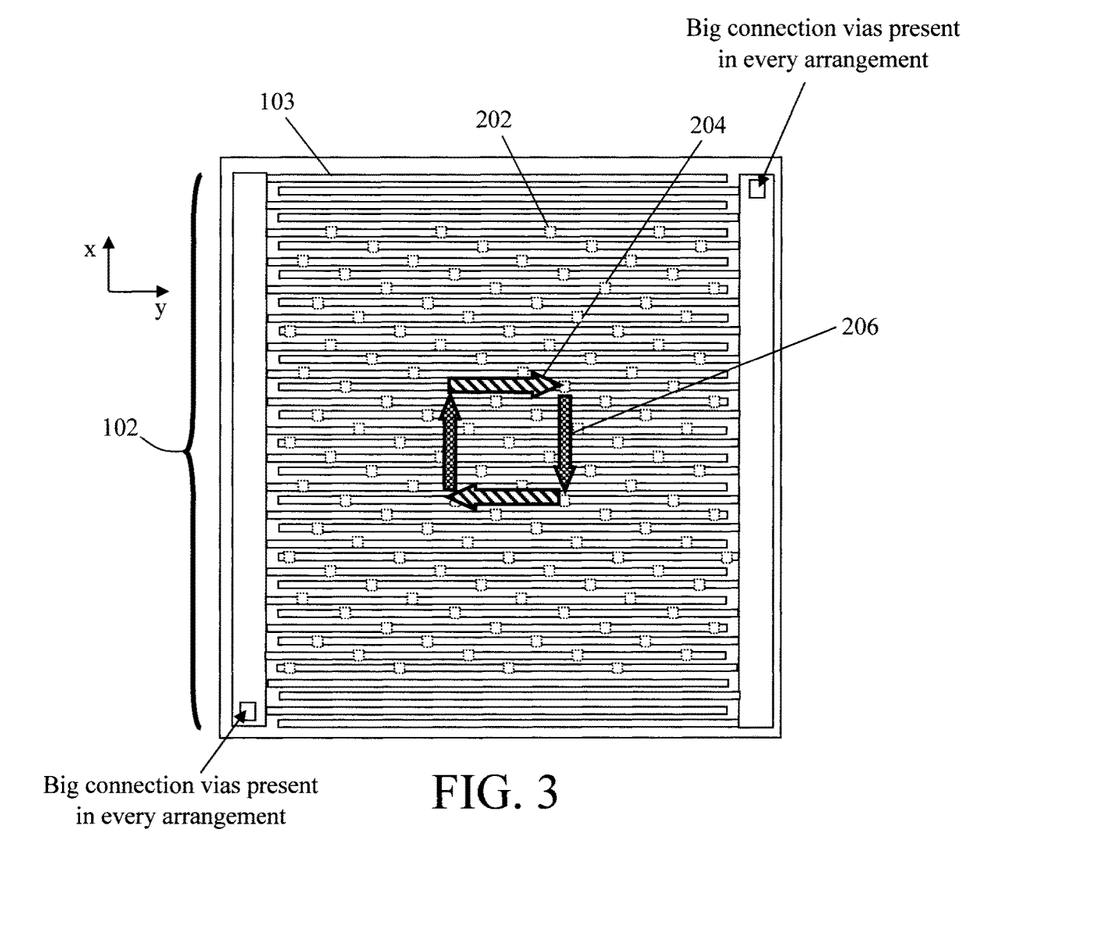
FIG. 3 is a top-down view of a top metal layer of the capacitor according to an embodiment of the present invention.
Figure 4:
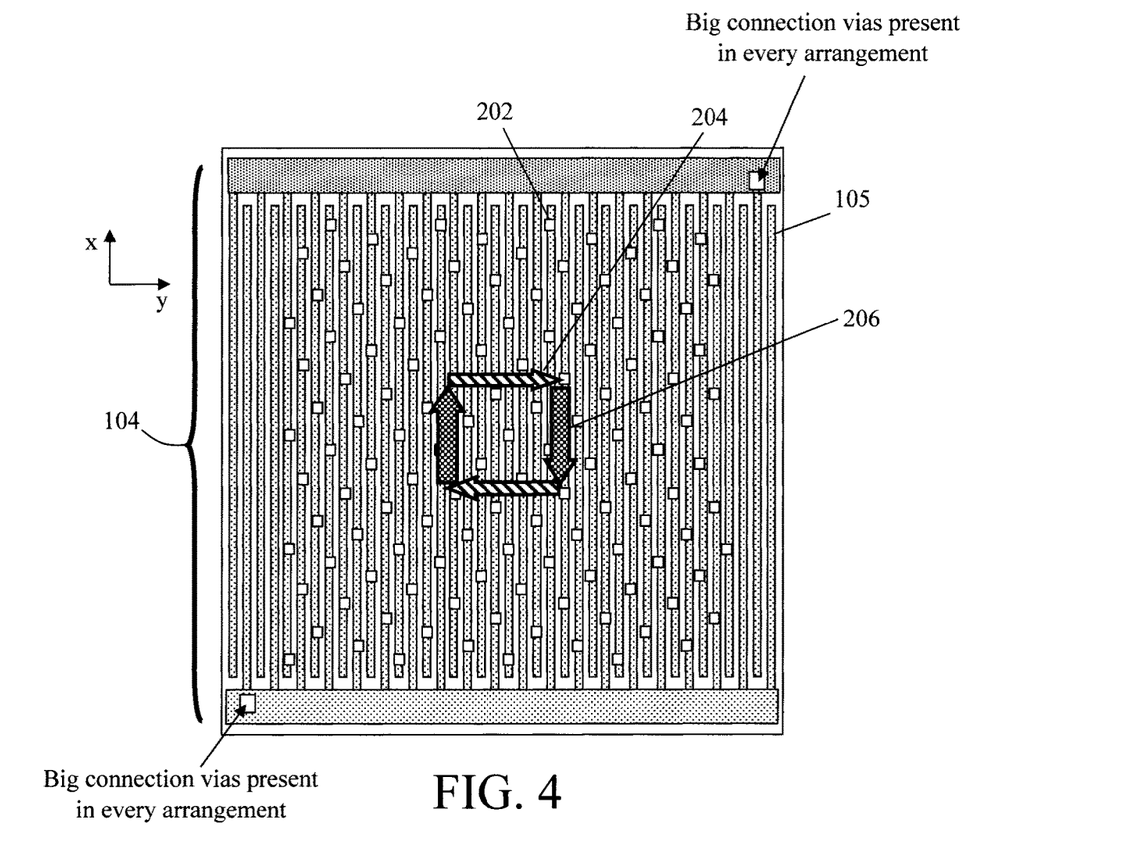
FIG. 4 is a top-down view of a bottom metal layer of the capacitor according to an embodiment of the present invention.
Figure 5:
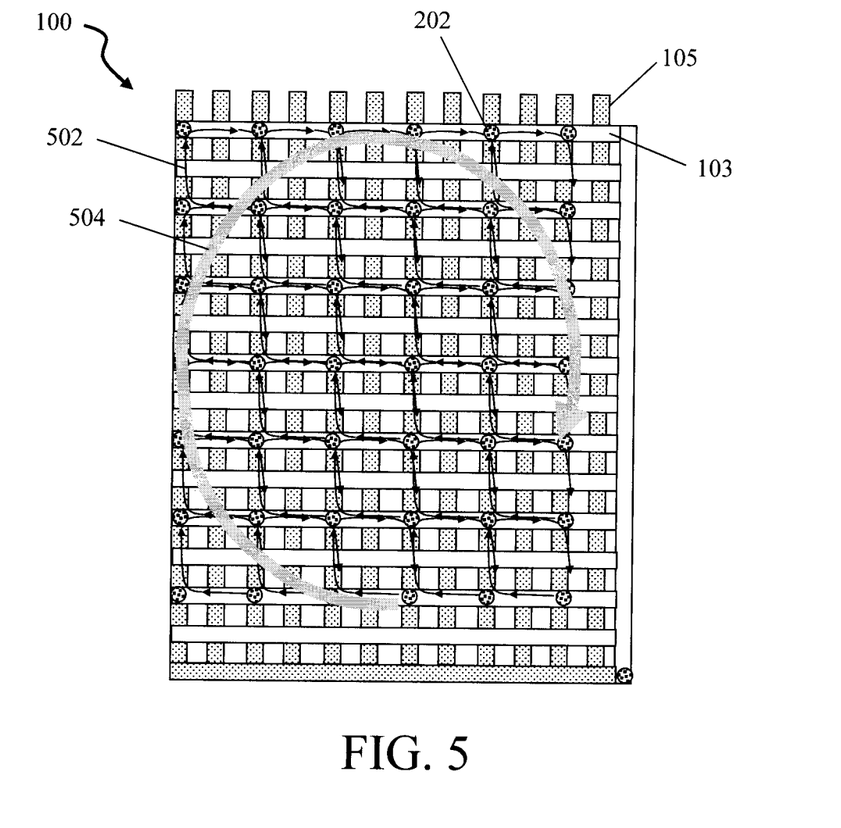
FIG. 5 is a top-down view of the top metal layer present on the bottom metal layer and the induction of a net eddy current flow in the capacitor according to an embodiment of the present invention.

The induction of an eddy current in the capacitor 100 based on the conductive loops created in the metal layers 102 and 104 is illustrated schematically using top-down views in FIGS. 3-5. For instance, FIG. 3 is a top-down view of metal layer 102 of capacitor 100. In the present non-limiting example, metal layer 102 is the top layer (Metal M) of capacitor 100. Thus, when viewed from the top-down, the inter-layer vias 202 interconnecting metal layer 102 and the underlying metal layer 104 would not be visible (since they are situated below the fingers 103). However, for the purpose of illustrating the conductive loops that exist in the present design, inter-layer vias 202 are provided in FIG. 3 (using dashed lines to indicate that these inter-layer vias 202 are in fact below the fingers 103). The same arrows 204 (compare FIG. 2 and FIG. 3) are used to indicate the conductive paths along the y-direction in fingers 103 (as compared to the conductive path along the x-direction in fingers 105 as indicated by arrows 206).

FIG. 4 is a top-down view of metal layer 104 of capacitor 100. In the present non-limiting example, metal layer 104 is the bottom layer (Metal M−1) of capacitor 100. Thus, when viewed from the top-down, the inter-layer vias 202 interconnecting metal layer 102 and the underlying metal layer 104 are present on top of the fingers 105. The same arrows 206 (compare FIG. 2 and FIG. 4) are used to indicate the conductive paths along the x-direction in fingers 105 (as compared to the conductive path along the y-direction in fingers 103 as indicated by arrows 204).

Thus, when the metal layer 102 is combined with metal layer 104, these conductive paths (see arrows 204 and 206), interconnected by inter-layer vias 202, create loops 502. See FIG. 5. FIG. 5 is a top-down view of the metal layer 102 present on top of metal layer 104 as per the present design of capacitor 100. As a result, when an inductor is formed on top of capacitor 100 (see below), these loops 502 enable the induction of a net eddy current flow (see arrow 504) in the capacitor 100. As highlighted above, this eddy current flow induced in capacitor 100 interactively changes the inductor characteristics backwards, thereby enabling co-tuning of inductance in the LC tank oscillator.

Figure 6:
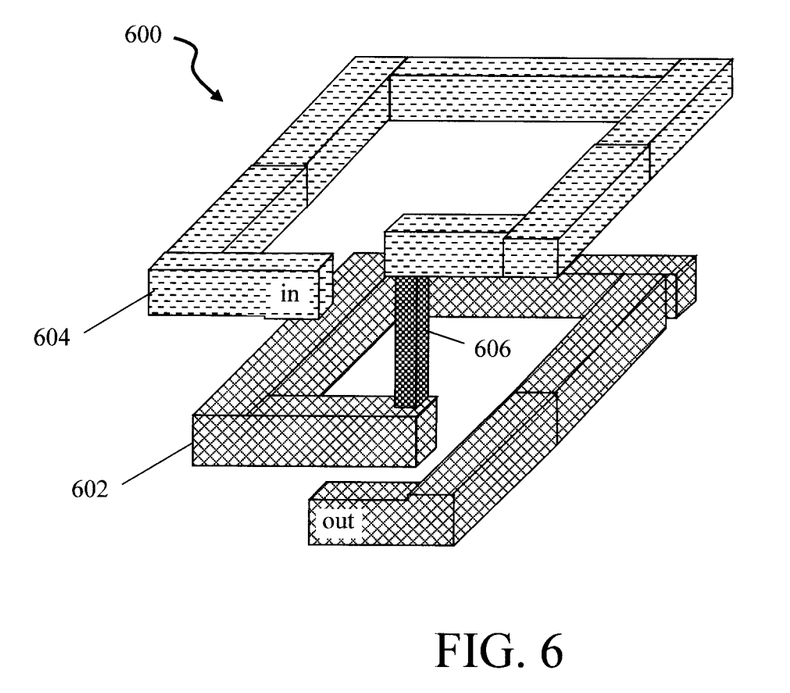
FIG. 6 is a three-dimensional diagram illustrating an exemplary inductor that can be formed on top of the capacitor to form an LC tank oscillator according to an embodiment of the present invention.

FIG. 6 is a three-dimensional diagram illustrating an exemplary inductor 600 that can be formed on top of the capacitor 100 to complete the LC tank oscillator. As shown in FIG. 6, inductor 600 includes a (first) inductor metal layer 602 (i.e., Inductor Metal N−1), a (second) inductor metal layer 604 (i.e., Inductor Metal N), and a via 606 interconnecting the inductor metal layers 602 and 604. Standard BEOL metallization techniques can be employed to form inductor 600.

During operation, a voltage (in) is applied for example to inductor metal layer 604. Electric charge passes from inductor metal layer 604 to inductor metal layer 602 by way of via 606. When the inductor 600 is assembled to capacitor 100, the inductor metal layer 602 (out) is connected to the (top) metal layer 102 of capacitor 100. As electrical charge moves from the inductor 600 to the capacitor 100, the capacitor becomes increasingly more electromagnetically charged. That changing electromagnetic charge induces the eddy current (via the loops created by the alternating fingers 103/105 and inter-layer vias 202 as described above) in the capacitor 100. Generally, eddy currents are loops of electrical current induced within a conductor (e.g., inside the VNCAP here) by changing magnetic field.

As provided above, the present LC tank oscillator design is created by forming the inductor 600 on top of the capacitor 100. See, for example, FIG. 7 which is a three-dimensional diagram of an LC tank oscillator 700 having inductor 600 on top of capacitor 100. As described above, capacitor 100 includes metal layer 102 (VNCAP Metal M) and metal layer 104 (VNCAP Metal M−1) each consisting of multiple interdigitated metal fingers 103 and 105, respectively, and inter-layer vias 202 (VNCAP Via M−1) interconnecting the metal layers 102 and 104. Inductor 600 includes inductor metal layer 602 (Inductor Metal N−1), inductor metal layer 604 (Inductor Metal N), and a via 606 (Inductor Via N−1) interconnecting the inductor metal layers 602 and 604. In this arrangement, M<N−1, so that capacitor 100 is under/below inductor 600. As shown schematically by arrow 702 in FIG. 7, the capacitor 100 and the inductor 600 are interconnected, e.g., by a chain of other metals/vias in between inductor metal layer 602 (i.e., Inductor Metal N−1) and metal layer 102 (i.e., VNCAP Metal M). In the capacitor 100, the anode is marked with a "+" and the cathode with "−" for clarity.

Figure 7:
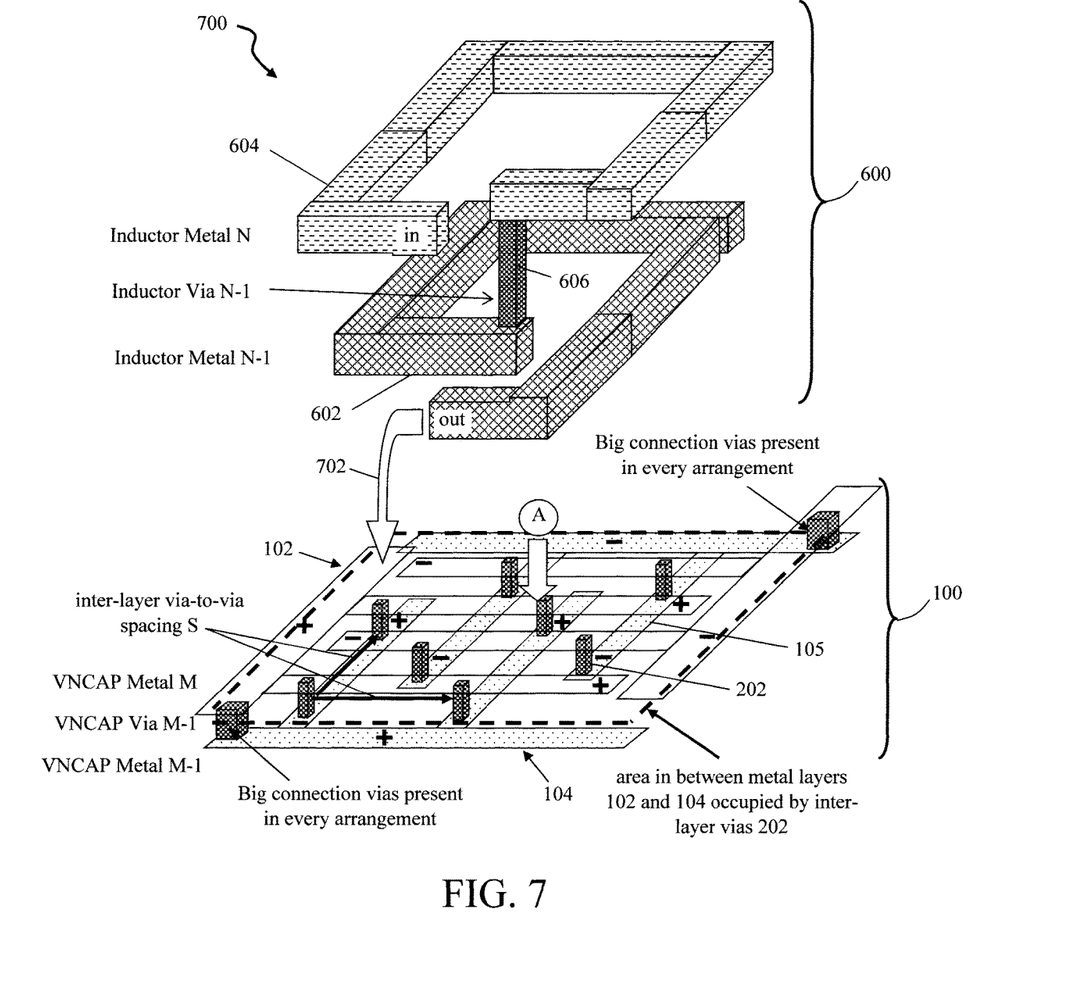
FIG. 7 is a three-dimensional diagram illustrating an LC tank oscillator having the inductor on top of the capacitor according to an embodiment of the present invention.

FIG. 7 is intended to illustrate the various layer/components of capacitor 100 and inductor 600. Both capacitor 100 and inductor 600 can be fabricated using standard CMOS processing techniques. Thus, as would be apparent to one skilled in the art, all inductor, capacitor and other elements shown would be buried inside layers of dielectrics (not shown) that are used as a global background in today's integrated circuits.

As highlighted above, a notable aspect of the present techniques is that the inductance and capacitance of LC tank oscillator 700 can be co-tuned by varying the arrangement (i.e., the number and location) of the inter-layer vias 202. For instance, designs are contemplated herein where the inter-layer vias 202 fully cover the area between the metal layers 102 and 104 (100% inter-layer via density) to designs where no inter-layer vias 202 are present (0% inter-layer via density, except for the two big connection vias in the diagonal corners of tab area—see also FIG. 3 and FIG. 4) and arrangements therebetween. For instance, LC tank oscillator designs are contemplated herein where the inter-layer vias 202 are arranged in an O-shaped pattern where the inter-layer vias 202 are situated along the perimeter of the area between the metal layers 102 and 104 at varying densities (e.g., from about 60% inter-layer via density to about 90% inter-layer via density, and ranges therebetween). Conversely, designs are also contemplated herein where the inter-layer vias 202 are absent from the perimeter and instead arranged at the center of the area between the metal layers 102 and 104 at varying densities (e.g., from about 10% inter-layer via density to about 40% inter-layer via density, and ranges therebetween).

The area between the metal layers 102 and 104 in which the inter-layer vias 202 are present is highlighted in FIG. 7. Reference is made herein to the arrangement (number and/or location) of the inter-layer vias 202 in this area. For instance, say that a spacing S is employed between the inter-layer vias 202 (see FIG. 7) meaning that for every inter-layer via 202 present the potential location for another adjacent inter-layer via 202 is a distance S away from that via. By 'potential location' it is meant that the location may or may not have an inter-layer via present (see the various inter-layer via arrangements presented below). When each of these locations contain an inter-layer via 202 (such as is shown in FIG. 7) then the inter-layer via density is 100%, meaning that the entire area between the metal layers 102 and 104 is populated with inter-layer vias 202. Conversely, when the area between the metal layers 102 and 104 contains no inter-layer via 202, the inter-layer via density is 0%. By way of example only, according to an exemplary embodiment, S is from about 190 nanometers (nm) to about 960 nm, and ranges therebetween.

Further, in the description that follows, reference will also be made to top-down depictions of this area (e.g., from viewpoint A) with respect to the inter-layer via 202 arrangement (number and location), with the area being generally represented as a square shape defined by the metal layers 102 and 104 above and below the area. The perimeter of this (square-shaped) area is the portion along its edges (i.e., excluding the center). Thus, by comparison with a 100% inter-layer via density where every location is populated with an inter-layer via 202, designs having inter-layer vias 202 along only the perimeter will have an inter-layer via density of less than 100% with inter-layer vias 202 being present along the edges of the area, but absent from its center. Similarly, designs having inter-layer vias 202 in the center of the area between the metal layers 102 and 104 also will have an inter-layer via density of less than 100% but with the inter-layer vias 202 being present at the center of the area, and absent from the edges.

Figure 8:
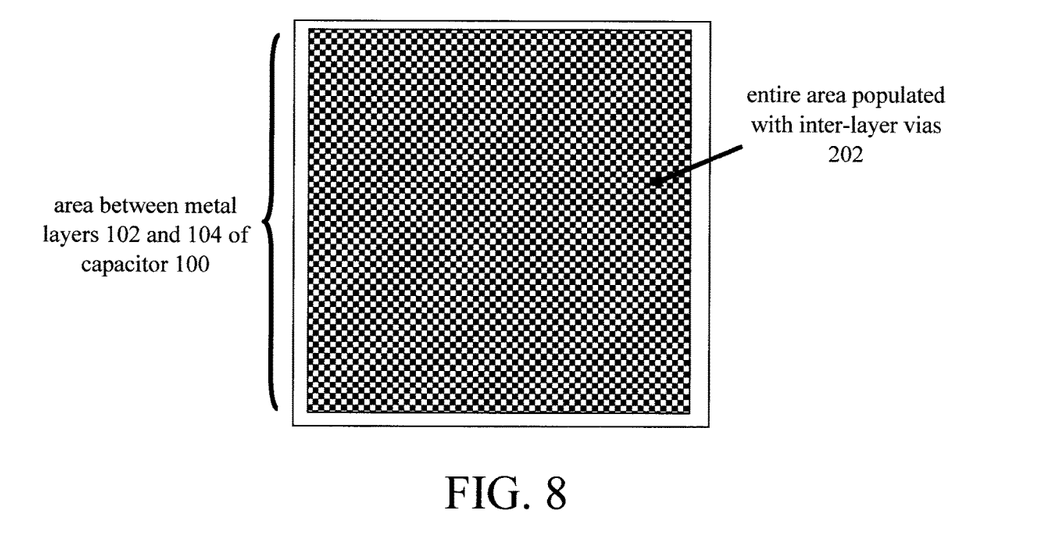
FIG. 8 is a top-down view of the area between the metal layers of the capacitor in a design employing 100% inter-layer via density according to an embodiment of the present invention.

Namely, referring to a top-down depiction of the area between the metal layers 102 and 104, a design employing 100% inter-layer via density is shown in FIG. 8. As provided above, with a 100% inter-layer via density, each potential location a distance S away from an inter-layer via 202 is populated with another inter-layer via 202. In FIG. 8, shading is used to indicate the portion of the area between the metal layers 102 and 104 that is populated with inter-layer vias 202. Thus, in the case of 100% inter-layer via density, the entire area between the metal layers 102 and 104 is populated with inter-layer vias 202 as shown in FIG. 8.

Figure 9:
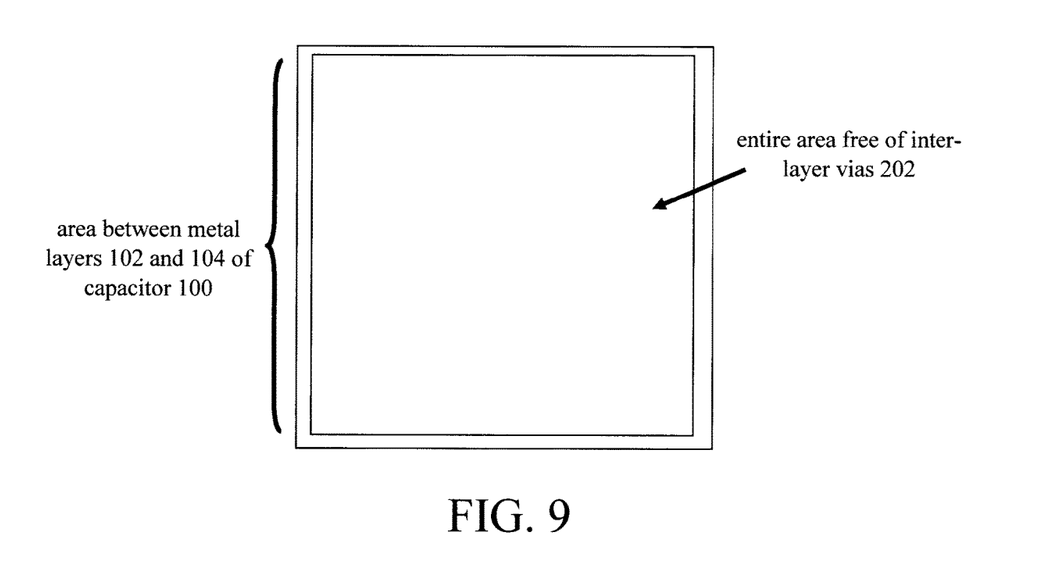
FIG. 9 is a top-down view of the area between the metal layers of the capacitor in a design employing 0% inter-layer via density according to an embodiment of the present invention.

On the other hand, with a design employing 0% inter-layer via density, the entire area between the metal layers 102 and 104 is free of inter-layer vias 202. See FIG. 9 (also a top-down depiction of the area between the metal layers 102 and 104).

As highlighted above, selective arrangements (i.e., varying the number and/or location) of the inter-layer vias 202 in the area between the metal layers 102 and 104 are contemplated herein. These designs vary the number and or location of the inter-layer vias 202 with respect to a 0% and 100% inter-layer via density to co-tune inductance and capacitance of the LC tank oscillator design.

Figure 10:
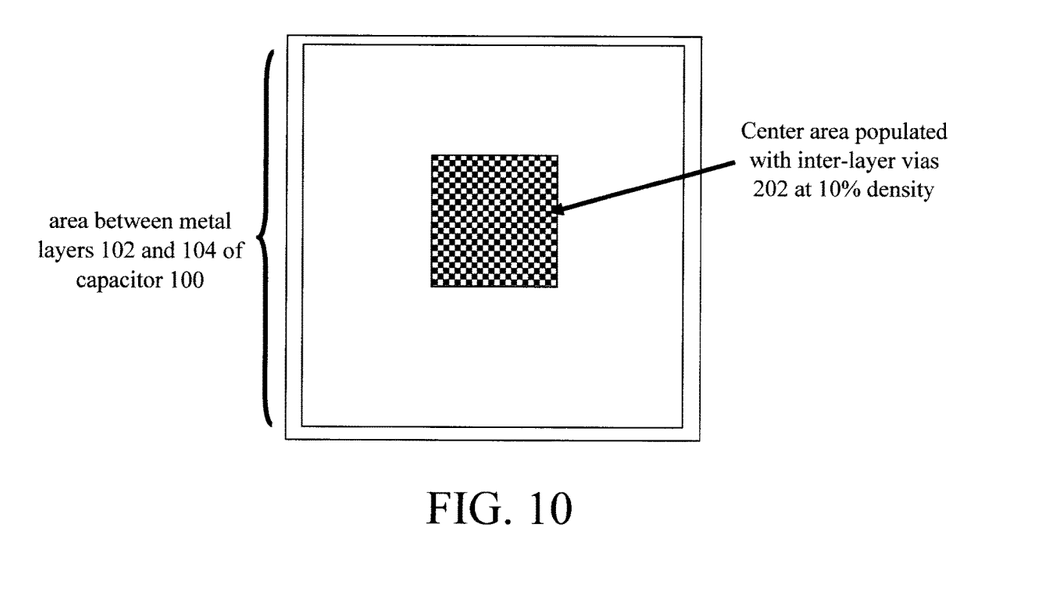
FIG. 10 is a top-down view of the area between the metal layers of the capacitor in a design employing inter-layer vias only in the center of the area with a density of 10% according to an embodiment of the present invention.

For instance, designs are contemplated herein where the inter-layer vias 202 are located in only the center of the area between the metal layers 102 and 104. See, for example, FIG. 10 (also a top-down depiction of the area between the metal layers 102 and 104). In FIG. 10, shading is used to indicate the portion of the area between the metal layers 102 and 104 that is populated with inter-layer vias 202. In this particular example, the inter-layer vias density is 10%. Namely, as compared to the 100% inter-layer via density shown in FIG. 8, only 10% of the area between the metal layers 102 and 104 contains inter-layer vias 202 which, in this design, are located at the center of the area (and absent from the perimeter).

Figure 11:
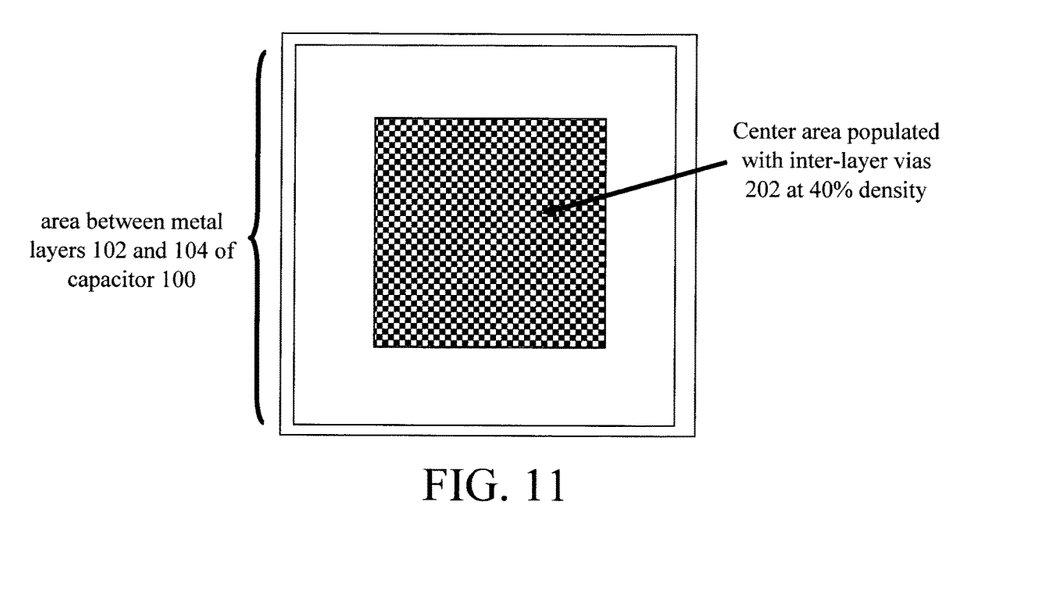
FIG. 11 is a top-down view of the area between the metal layers of the capacitor in a design employing inter-layer vias only in the center of the area with a density of 40% according to an embodiment of the present invention.

With the same center-location design, the inter-layer via density can also be increased to affect the L and C co-tuning. See, for example, FIG. 11 (also a top-down depiction of the area between the metal layers 102 and 104). In FIG. 11, shading is again used to indicate the portion of the area between the metal layers 102 and 104 that is populated with inter-layer vias 202. In this particular example, the inter-layer vias density is 40%. Namely, as compared to the 100% inter-layer via density shown in FIG. 8, only 40% of the area between the metal layers 102 and 104 contains inter-layer vias 202 which, in this design, are located at the center of the area (and absent from the perimeter). As will be described in detail below, for a given design (center-location, perimeter, etc.) an increase in the inter-layer via density generally decreases the inductance at a given operational frequency.

Figure 12:
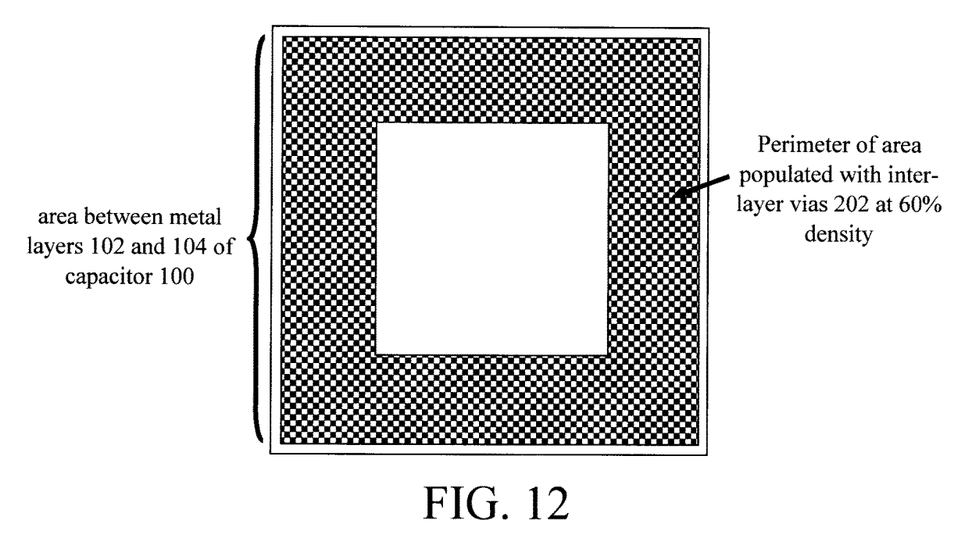
FIG. 12 is a top-down view of the area between the metal layers of the capacitor in a design employing inter-layer vias only along the perimeter of the area with a density of 60% according to an embodiment of the present invention.

As highlighted above, designs are also contemplated herein where the inter-layer vias 202 are located along only the perimeter of the area between the metal layers 102 and 104, i.e., an "O-shaped" arrangement. See, for example, FIG. 12 (also a top-down depiction of the area between the metal layers 102 and 104). In FIG. 12, shading is again used to indicate the portion of the area between the metal layers 102 and 104 that is populated with inter-layer vias 202. In this particular example, the inter-layer vias density is 60%. Namely, as compared to the 100% inter-layer via density shown in FIG. 8, only 60% of the area between the metal layers 102 and 104 contains inter-layer vias 202 which, in this design, are located along the perimeter of the area (and absent from the center).

Figure 13:
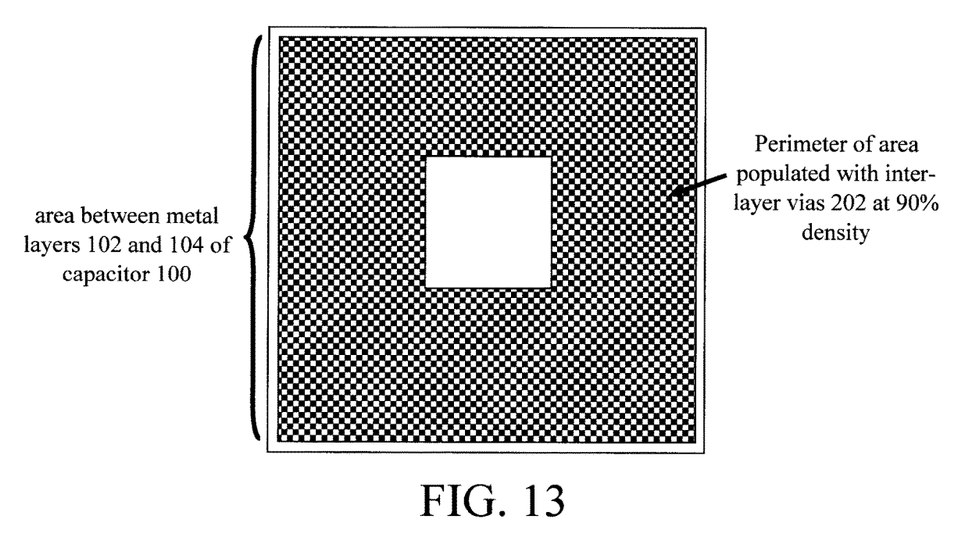
FIG. 13 is a top-down view of the area between the metal layers of the capacitor in a design employing inter-layer vias only along the perimeter of the area with a density of 90% according to an embodiment of the present invention.

With the same perimeter design, the inter-layer via density can also be increased to affect the L and C co-tuning. See, for example, FIG. 13 (also a top-down depiction of the area between the metal layers 102 and 104). In FIG. 13, shading is again used to indicate the portion of the area between the metal layers 102 and 104 that is populated with inter-layer vias 202. In this particular example, the inter-layer vias density is increased to 90%. As will be described in detail below, for a given design (center-location, perimeter, etc.) an increase in the inter-layer via density generally decreases the inductance at a given operational frequency.

Figure 14A:
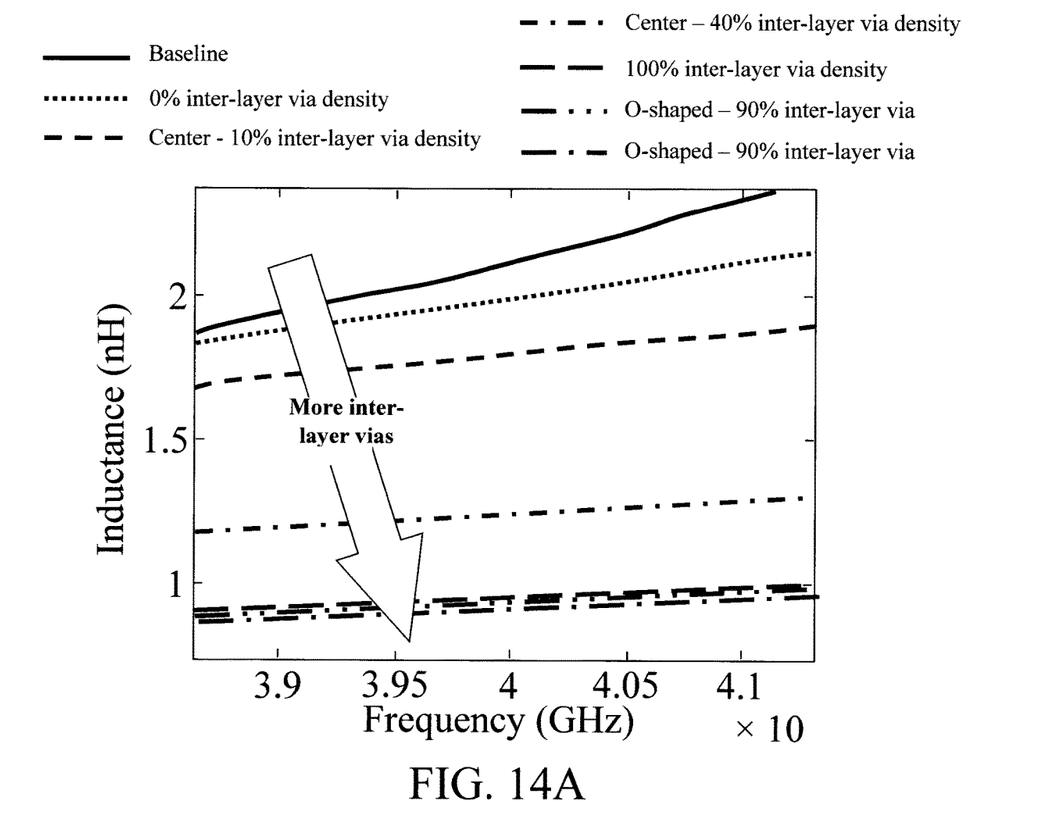
FIG. 14A is a diagram illustrating the inductance (L) and LC tank oscillator frequency as a function of inter-layer via density according to an embodiment of the present invention.
Figure 14B:
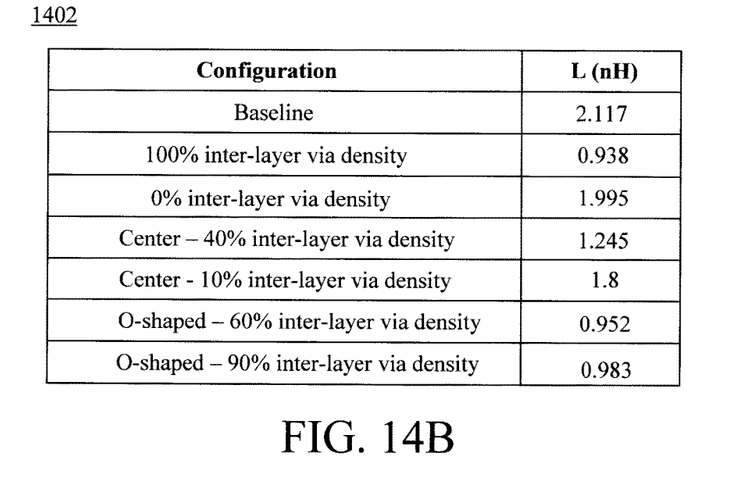
FIG. 14B is a diagram illustrating inductance (L) values for a variety of different via arrangements according to an embodiment of the present invention.

FIG. 14A is a diagram illustrating the inductance (L) and LC tank oscillator frequency (i.e., speed) as a function of inter-layer via density for the various arrangements depicted in FIGS. 8-13 during operation (against a baseline configuration, i.e., the inductor 600 only and no capacitor 100). In general, for a given arrangement, increasing the inter-layer via density decreases the inductance, and increases the LC tank oscillator speed. As such, varying the number of inter-layer vias 202 (so as to vary the inter-layer via density) during fabrication of the capacitor can be used to tune (increase or decrease) the inductance (L) and frequency of the present LC tank oscillator. For instance, as shown in FIG. 14A having no inter-layer vias 202 (0% inter-layer via density) provides the highest inductance (and lowest oscillation frequency) whereas a 100% inter-layer via density provides the lowest inductance (and highest oscillation frequency). Further, increasing the inter-layer via density in the center-location arrangement (Center) from 10% to 40% decreases the inductance, as does increasing the inter-layer via density in the O-shaped/perimeter arrangement (O-shaped) from 60% to 90%. For instance, referring briefly to diagram 1402 in FIG. 14B, inductance (L) values (measured in nanohenries (nH)) are given for each of the above-described via arrangement configurations. Referring to FIG. 14B, it is notable that the inductance values for the configurations: 100% inter-layer via density, O-shaped 60% inter-layer via density, and O-shaped 90% inter-layer via density are similar. That is why they overlap in the plot in FIG. 14A and are hard to discern individually.

Also, the location of the inter-layer vias 202 affects the inductance. For instance, as shown in FIG. 14A, an O-shaped/perimeter arrangement generally reduces the inductance by a greater amount than the center-location arrangement. As such, varying the location of inter-layer vias 202 (so as to vary the arrangement design) during fabrication of the capacitor can be used to tune (increase or decrease) the inductance (L) of the present LC tank oscillator.

Further, as described for example in conjunction with the description of FIG. 5 above, the conductance loops created between the metal layers 102 and 104 of capacitor 100 by placement of the inter-layer vias 202 creates a net eddy current flow 504 in capacitor 100. The net eddy current flow produced by employing a 100% inter-layer via density and an O-shaped/perimeter arrangement is similar since the inter-layer vias 202 in both arrangements are located beneath the eddy current spiral. See for example FIG. 14A wherein the 100% inter-layer via density example and the O-shaped arrangement (with 90% inter-layer via density) produce similar results in terms of inductance and operational frequency. These results indicate that, in terms of the O-shaped arrangement, placing additional inter-layer vias 202 at the center would have little effect on inductance or frequency.

Figure 15:
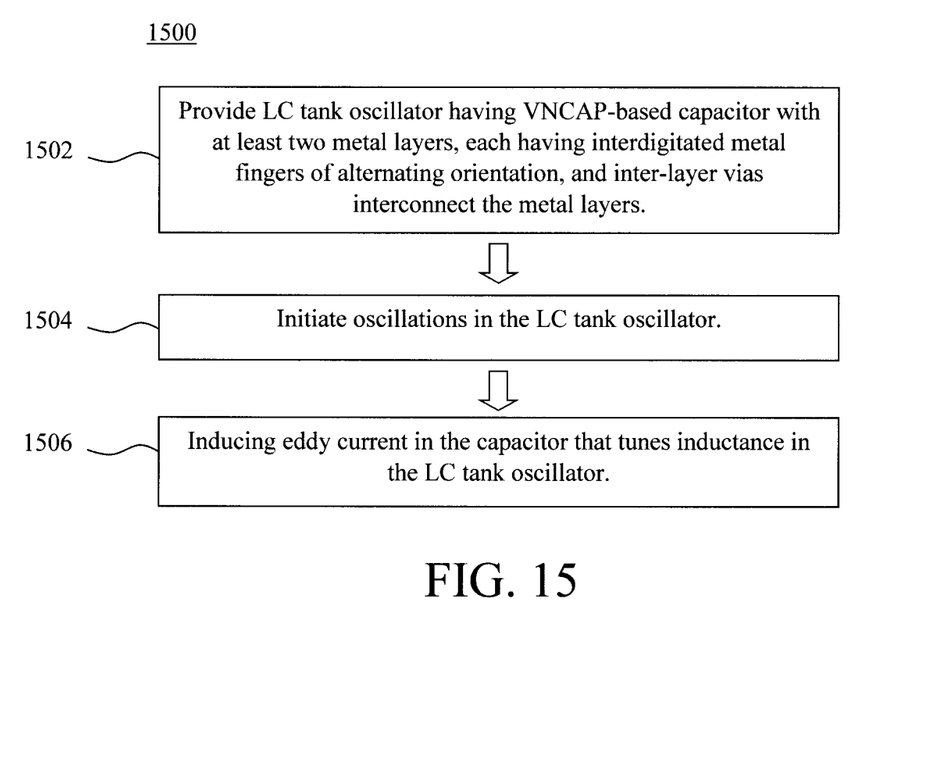
FIG. 15 is a diagram illustrating an exemplary methodology for operating an LC tank oscillator according to an embodiment of the present invention.

Based on the above-described techniques, an exemplary methodology 1500 for operating an LC tank oscillator is now described by way of reference to FIG. 15. The process begins in step 1502 with LC tank oscillator 700. As described in conjunction with the description of FIG. 7 above, LC tank oscillator 700 includes capacitor 100 and inductor 600 on the capacitor 100. The capacitor 100 includes i) at least two metal layers 102 and 104, each having interdigitated metal fingers 103 and 105, respectively, of alternating orientation. Inter-layer vias 202 interconnect the layers 102 and 104.

In step 1504, oscillations are initiated in the LC tank oscillator. According to an exemplary embodiment, the oscillations are initiated by applying a voltage to the inductor 600. Electrical charge moves from the inductor 600 to the capacitor 100, electromagnetically charging the capacitor. Once the charge on the capacitor 100 exceeds that of the inductor 600, the energy flows back toward the inductor 600. This process repeats itself over and over creating electromagnetic oscillations.

As described above, that oscillating electromagnetic charge induces the eddy current (via the conductive loops created by the alternating fingers 103/105 and inter-layer vias 202 as described above) in the capacitor 100. It is that eddy current that tunes inductance in the LC tank oscillator. See step 1506.

Tuning the eddy currents is based on the arrangement of the inter-layer vias 202 that occurs during fabrication of the capacitor 100. See, for example, exemplary methodology 1600 of FIG. 16 for co-tuning inductance and capacitance in an LC tank oscillator. In step 1602, the capacitor 100 is formed at least two metal layers 102 and 104, each having interdigitated metal fingers 103 and 105, respectively, of alternating orientation. Inter-layer vias 202 interconnect the layers 102 and 104. Standard CMOS processing techniques well-known in the art can be used to fabricate the components of LC tank oscillator 700 including capacitor 100 and the inductor 600.

Figure 16:
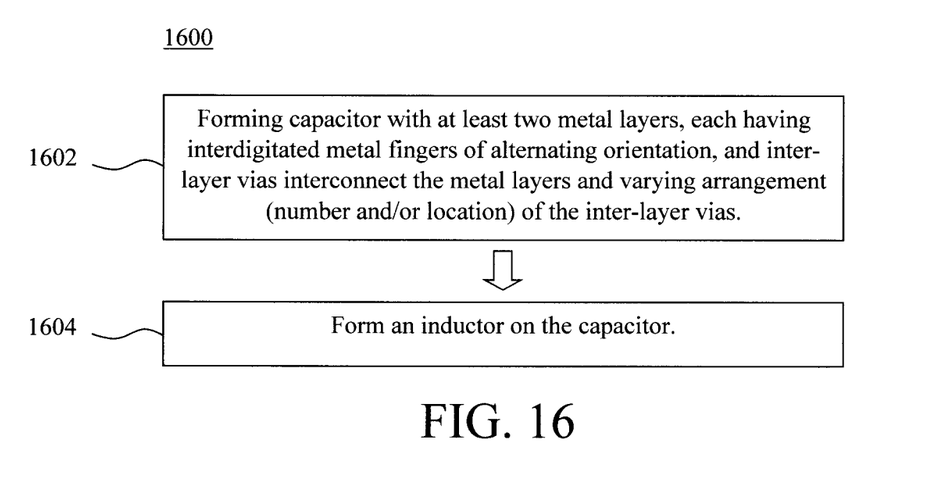
FIG. 16 is a diagram illustrating an exemplary methodology for co-tuning inductance and capacitance in an LC tank oscillator according to an embodiment of the present invention.

As shown in FIG. 16, step 1602 includes varying an arrangement (i.e., number and/or location) of the inter-layer vias 202 in the area between the metal layers 102 and 104 to co-tune both inductance and capacitance in the LC tank oscillator. For instance, as described above, varying the arrangement of the inter-layer vias can include arrangements where this area between the metal layers 102 and 104 is fully populated with the inter-layer vias 202, arrangements where there are no inter-layer vias 202 between the metal layers 102 and 104, arrangements where the inter-layer vias 202 are present along only a perimeter of the area between the metal layers 102 and 104 (with varying density), arrangements where the inter-layer vias 202 are present only in a center of the area between the metal layers 102 and 104 (with varying density), etc.

In step 1604, the inductor 600 is formed on the capacitor 100. Again, standard CMOS processing techniques well-known in the art can be used to fabricate the inductor 600.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. An inductor-capacitor (LC) tank oscillator, comprising:
   a capacitor comprising at least two metal layers, each metal layer having metal fingers that are interdigitated, wherein an orientation of the metal fingers alternates amongst the at least two metal layers;
   an inductor on the capacitor,
   wherein an inductance and a capacitance in the LC tank oscillator are tuneable, and wherein the LC tank oscillator further comprises:
   inter-layer vias interconnecting the at least two metal layers, wherein an arrangement of the inter-layer vias in an area between the at least two metal layers is configured to co-tune both the inductance and the capacitance in the LC tank oscillator.

2. The LC tank oscillator of claim 1, wherein the at least two metal layers are stacked, one on top of another, along a z-direction.

3. The LC tank oscillator of claim 2, wherein the orientation of the metal fingers alternates between being along an x-direction and a y-direction amongst the at least two metal layers.

4. The LC tank oscillator of claim 1, wherein the inductor comprises:
   a first inductor metal layer;
   a second inductor metal layer over the first inductor metal layer; and
   a via interconnecting the first inductor metal layer and the second inductor metal layer.

5. The LC tank oscillator of claim 1, wherein the inter-layer vias fully populate the area between the at least two metal layers.

6. The LC tank oscillator of claim 1, wherein the inter-layer vias are present along only a perimeter of the area between the at least two metal layers.

7. The LC tank oscillator of claim 1, wherein the inter-layer vias are present only in a center of the area between the at least two metal layers.

8. A method of operating an LC tank oscillator, the method comprising the steps of:
   providing the LC tank oscillator comprising a capacitor and an inductor on the capacitor, the capacitor comprising: i) at least two metal layers, each metal layer having metal fingers that are interdigitated, wherein an orientation of the metal fingers alternates amongst the at least two metal layers, and ii) inter-layer vias interconnecting the at least two metal layers, wherein an inductance and a capacitance in the LC tank oscillator are tuneable;
   initiating oscillations in the LC tank oscillator; and
   inducing a net eddy current in the capacitor based on an arrangement of the inter-layer vias, whereby the net eddy current tunes inductance in the LC tank oscillator.

9. The method of claim 8, wherein the at least two metal layers are stacked, one on top of another, along a z-direction.

10. The method of claim 9, wherein the orientation of the metal fingers alternates between being along an x-direction and a y-direction amongst the at least two metal layers.

11. The method of claim 8, wherein the inductor comprises:
- a first inductor metal layer;
- a second inductor metal layer over the first inductor metal layer; and
- a via interconnecting the first inductor metal layer and the second inductor metal layer.

12. A method of co-tuning inductance and capacitance in an LC tank oscillator, the method comprising the steps of:
- forming the LC tank oscillator comprising: a capacitor having i) at least two metal layers, each metal layer having metal fingers that are interdigitated, wherein an orientation of the metal fingers alternates amongst the at least two metal layers, and ii) inter-layer vias interconnecting the at least two metal layers, and wherein the forming further comprises varying an arrangement of the inter-layer vias in an area between the at least two metal layers to co-tune both inductance and capacitance in the LC tank oscillator, wherein the arrangement of the inter-layer vias comprises one or more of a number and a location of the inter-layer vias; and
- forming an inductor on the capacitor.

13. The method of claim 12, wherein the at least two metal layers are stacked, one on top of another, along a z-direction.

14. The method of claim 13, wherein the orientation of the metal fingers alternates between being along an x-direction and a y-direction amongst the at least two metal layers.

15. The method of claim 12, wherein the inductor comprises:
- a first inductor metal layer;
- a second inductor metal layer over the first inductor metal layer; and
- a via interconnecting the first inductor metal layer and the second inductor metal layer.

16. The method of claim 12, wherein the step of varying the arrangement of the inter-layer vias in the area between the at least two metal layers comprises:
- varying at least one of a number and a location of the inter-layer vias in the area between the at least two metal layers.

17. The method of claim 16, further comprising the step of:
- fully populating the area between the at least two metal layers with the inter-layer vias.

18. The method of claim 16, further comprising the step of:
- arranging the inter-layer vias along only a perimeter of the area between the at least two metal layers.

19. The method of claim 16, further comprising the step of:
- arranging the inter-layer vias only in a center of the area between the at least two metal layers.

* * * * *